(12) United States Patent
Greenwood

(10) Patent No.: US 11,901,494 B2
(45) Date of Patent: *Feb. 13, 2024

(54) PACKAGED LEDS WITH PHOSPHOR FILMS, AND ASSOCIATED SYSTEMS AND METHODS

(71) Applicant: Micron Technology, Inc., Boise, ID (US)

(72) Inventor: Jonathon G. Greenwood, Tampa, FL (US)

(73) Assignee: Micron Technology, Inc., Boise, ID (US)

( * ) Notice: Subject to any disclaimer, the term of this patent is extended or adjusted under 35 U.S.C. 154(b) by 289 days.

This patent is subject to a terminal disclaimer.

(21) Appl. No.: 17/391,703

(22) Filed: Aug. 2, 2021

(65) Prior Publication Data
US 2021/0359173 A1 Nov. 18, 2021

Related U.S. Application Data

(60) Continuation of application No. 15/464,596, filed on Mar. 21, 2017, now Pat. No. 11,081,625, which is a
(Continued)

(51) Int. Cl.
*H01L 33/50* (2010.01)
*H01L 33/48* (2010.01)
(Continued)

(52) U.S. Cl.
CPC .......... *H01L 33/505* (2013.01); *H01L 24/48* (2013.01); *H01L 25/167* (2013.01);
(Continued)

(58) Field of Classification Search
CPC ..... H01L 33/505; H01L 33/486; H01L 33/56; H01L 33/508; H01L 33/58; H01L 2924/181; H01L 33/48; H01L 33/50
See application file for complete search history.

(56) References Cited

U.S. PATENT DOCUMENTS

| 7,125,917 B2 | 10/2006 | Starkey |
| 7,176,501 B2 | 2/2007 | Lee et al. |

(Continued)

FOREIGN PATENT DOCUMENTS

| CN | 1340864 A | 3/2002 |
| CN | 1547265 A | 11/2004 |

(Continued)

OTHER PUBLICATIONS

Chinese Patent Application No. 201180030696.7—Reexamination Decision, dated May 27, 2019, with English Translation, 40 pages.
(Continued)

*Primary Examiner* — Shahed Ahmed
*Assistant Examiner* — Sun Mi Kim King
(74) *Attorney, Agent, or Firm* — Perkins Coie LLP

(57) ABSTRACT

Packaged LEDs with phosphor films, and associated systems and methods are disclosed. A system in accordance with a particular embodiment of the disclosure includes a support member having a support member bond site, an LED carried by the support member and having an LED bond site, and a wire bond electrically connected between the support member bond site and the LED bond site. The system can further include a phosphor film carried by the LED and the support member, the phosphor film being positioned to receive light from the LED at a first wavelength and emit light at a second wavelength different than the first. The phosphor film can be positioned in direct contact with the wire bond at the LED bond site.

20 Claims, 5 Drawing Sheets

Related U.S. Application Data division of application No. 12/819,795, filed on Jun. 21, 2010, now abandoned.

(51) Int. Cl.
| | |
|---|---|
| *H01L 23/00* | (2006.01) |
| *H01L 25/16* | (2023.01) |
| *H01L 33/56* | (2010.01) |
| *H01L 33/62* | (2010.01) |
| H01L 27/02 | (2006.01) |
| H01L 33/58 | (2010.01) |

(52) U.S. Cl.
CPC .......... *H01L 33/486* (2013.01); *H01L 33/56* (2013.01); *H01L 33/62* (2013.01); *H01L 27/0248* (2013.01); *H01L 33/508* (2013.01); *H01L 33/58* (2013.01); *H01L 2224/48091* (2013.01); *H01L 2224/48227* (2013.01); *H01L 2224/49113* (2013.01); *H01L 2924/181* (2013.01); *H01L 2933/0041* (2013.01)

(56) References Cited

U.S. PATENT DOCUMENTS

| | | | |
|---|---|---|---|
| 7,271,423 | B2 | 9/2007 | Hanamoto et al. |
| 7,273,768 | B2 | 9/2007 | Hwan |
| 7,372,198 | B2 | 5/2008 | Negley |
| 7,446,343 | B2 | 11/2008 | Mueller et al. |
| 7,511,312 | B2 | 3/2009 | Chae et al. |
| 7,554,129 | B2 | 6/2009 | Roth et al. |
| 7,649,209 | B2 | 1/2010 | Bergmann |
| 8,492,781 | B2 | 7/2013 | Van et al. |
| 8,546,159 | B2 * | 10/2013 | Yoo .......................... B32B 5/16 |
| | | | 438/27 |
| 8,598,612 | B2 | 12/2013 | Greenwood |
| 8,795,817 | B2 * | 8/2014 | Kwak .................. H01L 33/505 |
| | | | 428/206 |
| 11,081,625 | B2 * | 8/2021 | Greenwood .......... H01L 25/167 |
| 2005/0200796 | A1 | 9/2005 | Iwanaga et al. |
| 2005/0264194 | A1 | 12/2005 | Ng et al. |
| 2006/0284207 | A1 | 12/2006 | Park et al. |
| 2007/0004065 | A1 | 1/2007 | Schardt et al. |
| 2007/0013057 | A1 | 1/2007 | Mazzochette |
| 2007/0018573 | A1 | 1/2007 | Shioi |
| 2007/0029569 | A1 | 2/2007 | Andrews |
| 2007/0090759 | A1 | 4/2007 | Choi et al. |
| 2007/0161135 | A1 | 7/2007 | Keller et al. |
| 2007/0194422 | A1 | 8/2007 | Lai et al. |
| 2007/0194676 | A1 | 8/2007 | Tanda et al. |
| 2008/0105941 | A1 | 5/2008 | Chang et al. |
| 2008/0121911 | A1 | 5/2008 | Andrews et al. |
| 2008/0164482 | A1 * | 7/2008 | Obara ................. H01L 25/0753 |
| | | | 313/503 |
| 2008/0169480 | A1 | 7/2008 | Weng et al. |
| 2008/0173884 | A1 * | 7/2008 | Chitnis ................. H01L 33/508 |
| | | | 257/E33.061 |
| 2008/0254393 | A1 | 10/2008 | Chao et al. |
| 2008/0284315 | A1 | 11/2008 | Tasumi et al. |
| 2009/0001599 | A1 | 1/2009 | Foong et al. |
| 2009/0039762 | A1 * | 2/2009 | Park ..................... H01L 33/504 |
| | | | 257/E33.056 |
| 2009/0045422 | A1 | 2/2009 | Kato et al. |
| 2009/0072256 | A1 | 3/2009 | Park et al. |
| 2009/0314989 | A1 | 12/2009 | Wao et al. |
| 2010/0012957 | A1 | 1/2010 | Lin et al. |
| 2010/0013373 | A1 | 1/2010 | Hata et al. |
| 2010/0123386 | A1 | 5/2010 | Chen |
| 2010/0123855 | A1 | 5/2010 | Shin |
| 2010/0181582 | A1 | 7/2010 | Li et al. |
| 2011/0198780 | A1 | 8/2011 | Basin et al. |
| 2012/0187427 | A1 | 7/2012 | Chandra |

FOREIGN PATENT DOCUMENTS

| | | |
|---|---|---|
| CN | 1950956 A | 4/2007 |
| CN | 101278410 A | 10/2008 |
| CN | 101300687 A | 11/2008 |
| CN | 101513120 A | 8/2009 |
| CN | 101740707 A | 6/2010 |
| JP | 2007067204 A | 3/2007 |
| JP | 2008010800 A | 1/2008 |
| JP | 2009231785 A | 10/2009 |
| KR | 20040097881 A | 11/2004 |
| TW | 200730616 A | 8/2007 |
| WO | 2006127030 A1 | 11/2006 |

OTHER PUBLICATIONS

CN Patent Application No. 201180030696.7—Chinese Notification of Reexamination Office Action, dated Sep. 28, 2018, with English Translation, 19 pages.

International Search Report and Written Opinion dated Feb. 28, 2012 in International Application No. PCT/US2011/041166, 10 pages.

Office Action dated Jun. 24, 2015 in Chinese Application No. 201180030696.7, 11 pages.

Office Action dated Apr. 30, 2015 in Korean Patent Application No. 10-2013-7000706, 8 pages.

Office Action dated Dec. 5, 2016 in Chinese application No. 201180030696.7, 5 pages.

Office Action dated Mar. 10, 2016 in China Application No. 201180030696.7, 17 pages.

Office Action dated Nov. 30, 2017 in Chinese application No. 201180030696.7, 15 pages.

Office Action dated Oct. 28, 2015 in Korea Application No. 10-2013-7000706, 8 pages.

Sharp Corporation, Zenigata LED User's Guide, Nov. 2008, URL: http://sharp-world.com/products/device/catalog/index.html.

CN Patent Application No. 201910757452.7—First Office Action, dated Dec. 22, 2021, 15 pages with English translation.

CN Patent Application No. 201910757452.7—Second Office Action, dated Apr. 29, 2022, 8 pages translated.

* cited by examiner

PACKAGED LEDS WITH PHOSPHOR FILMS, AND ASSOCIATED SYSTEMS AND METHODS

CROSS-REFERENCE TO RELATED APPLICATION(S)

This application is continuation of U.S. patent application Ser. No. 15/464,596, filed Mar. 21, 2017, which is a divisional of U.S. patent application Ser. No. 12/819,795, filed Jun. 21, 2010, each of which are incorporated herein by reference in their entirety.

TECHNICAL FIELD

The present disclosure is directed generally to packaged light emitting diodes (LEDs) with phosphor films, and associated systems and methods.

BACKGROUND

LEDs are increasingly in demand for many purposes because such devices efficiently produce high-intensity, high-quality light. For example, mobile phones, personal digital assistants, digital cameras, MP3 players, and other portable devices use LEDs or other solid state lighting devices to produce white light for background illumination. LEDs may also be used in applications other than electronic devices, for example, in ceiling panels, desk lamps, refrigerator lights, table lamps, streets lights, automobile headlights, and other instances in which lighting is necessary or desirable.

One challenge associated with producing LEDs is containing production costs in a manner that allows LEDs to be priced competitively with other more conventional lighting sources. Because a significant fraction of the cost of an LED is attributed to the process for making the LED, manufacturers have attempted to reduce processing costs. One aspect of the processing costs relates to the use of phosphor in a packaged LED system. In particular, typical LEDs emit blue light, while many applications require or at least benefit from softer colored or white light. Accordingly, manufacturers coat such LEDs with a phosphor that absorbs a portion of the emitted blue light and re-emits the light as yellow light, producing a composite light emission that is white or at least approximately white.

Existing processes for providing a phosphor region in the emitted light path of an LED can add significantly to the cost of the LED. One such process includes placing the LED in a cavity or recess of a supporting substrate, and then filling the cavity with phosphor. Another approach includes placing the LED on a flat substrate and then building a dam around the LED and filling the interior region with phosphor. Still another approach includes depositing a phosphor layer directly on the LED die and then removing part of the phosphor to expose the underlying bond pads, thus allowing electrical connections to be made to the die. While the foregoing processes have resulted in LEDs that produce suitable light emission characteristics, they all contribute to the cost of the LED. Accordingly, there remains a need in the industry for an improved, low-cost processing technique.

DETAILED DESCRIPTION

Aspects of the present disclosure are directed generally to packaged light emitting diodes (LEDs) with phosphor films, and associated systems and methods. Specific details of several embodiments of the disclosure are described below with reference to particular LEDs to provide a thorough understanding of these embodiments. In other embodiments, aspects of the present disclosure can be used in conjunction with LEDs having other configurations. Several details describing structures or processes that are well-known and often associated with LEDs, but that may unnecessarily obscure some significant aspects of the present disclosure are not set forth in the following description for purposes of clarity. Moreover, although the following disclosure sets forth several embodiments of different aspects of the invention, several other embodiments can have different configurations, different components, and/or different processes or steps than those described in this section. Accordingly, the invention may have other embodiments with additional elements, and/or without several of the elements described below with reference to FIGS. 1-5.

Figure 1:
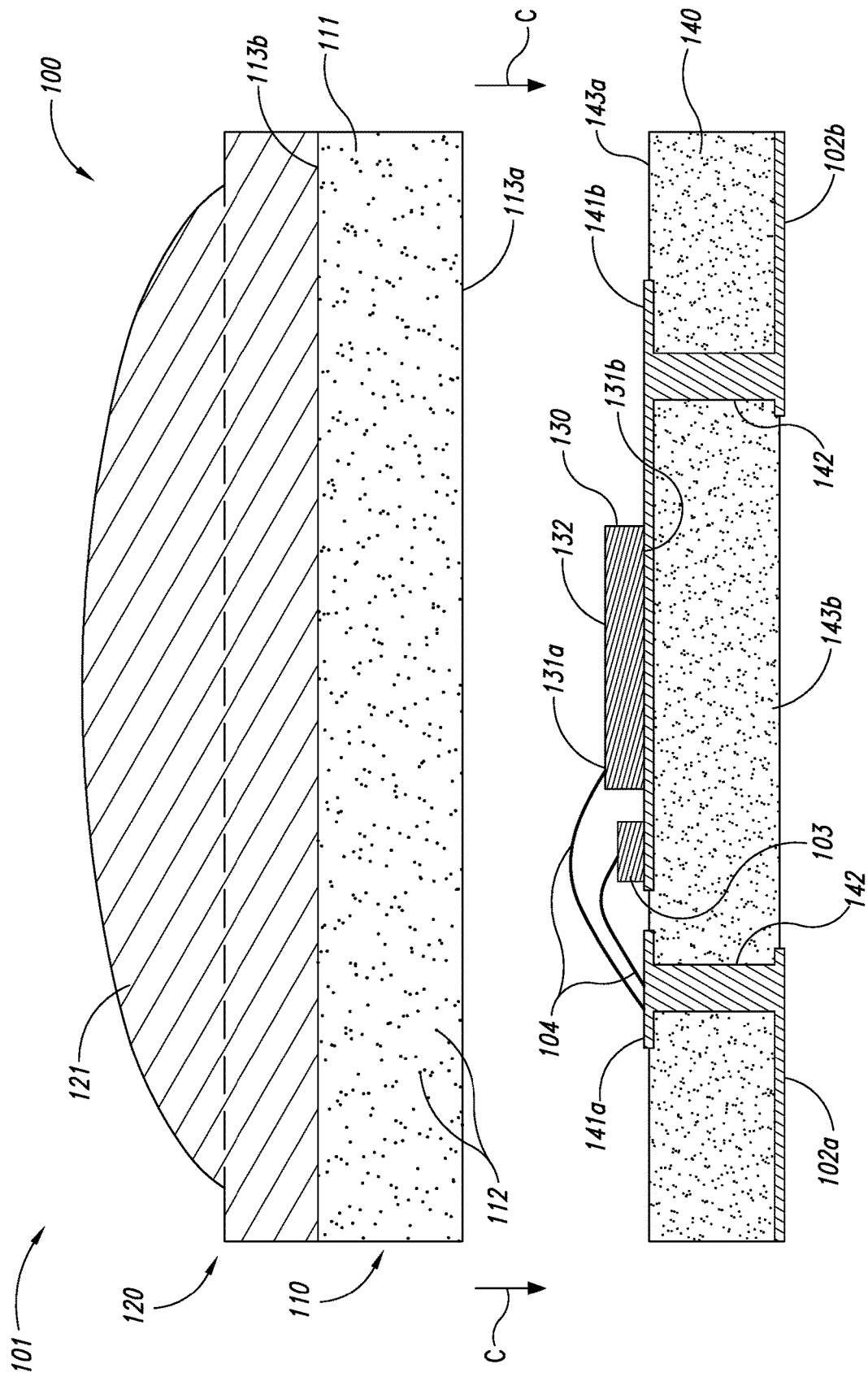
FIG. 1 is a partially schematic, cross-sectional side view of components of an LED system configured in accordance with an embodiment of the disclosure.

FIG. 1 is a partially schematic, cross-sectional side view of an LED system 100 that includes components that are combined to form a package 101 in accordance with an embodiment of the disclosure. These components can include a support member 140 carrying an LED 130, and a phosphor film 110 optionally supported by a carrier 120. The phosphor film 110 is conformal, and is attached to the LED 130 and the support member 140 after the LED 130 is connected to the support member 140 with wire bonds 104. Further details of this arrangement and associated processes are described below.

In a particular embodiment shown in FIG. 1, the support member 140 is formed from a ceramic or other suitable substrate material, and has a first (e.g., upwardly facing) surface 143a and a second (e.g., downwardly facing) surface 143b. Each support member 140 further includes first and second support member bond sites 141a, 141b (e.g., bond pads) that provide for electrical communication to and/or from the LED 130. Accordingly, each of the support member bond sites 141a, 141b is connected to corresponding package bond site 102a, 102b by a corresponding via 142 or other electrically conductive structure. The first and second packages bond sites 102a, 102b are accessible from outside the package 101 to facilitate physical and electrical connections between the package 101 and external devices (not shown in FIG. 1).

The support member 140 carries the LED 130, e.g., at the first support member surface 143a. The LED 130 can include a first LED bond site 131*a* and a second LED bond site 131*b*. The second LED bond site 131*b* can face toward and be electrically connected directly to the second support member bond site 141*b*. In another embodiment, the second LED bond site 131*b* can face away from the second support member bond site 141*b*, and can be connected to the second support member bond site 141*b* with a wire bond. In either embodiment, the first LED bond site 131*a* can be electrically connected to the first support member bond site 141*a* with a wire bond 104. In a particular aspect of an embodiment shown in FIG. 1, the package 101 can also include an electrostatic discharge (ESD) die 103 that provides protection for the LED 130 and that is also electrically connected to the first support member bond site 141*a* with a wire bond 104, and to the second support member bond site 141*b* with a suitable backside surface-to-surface connection. In other embodiments, the ESD die 103 can be omitted.

In an embodiment shown in FIG. 1, the LED 130 has an upwardly facing active surface 132 through which light (e.g., blue light) is emitted. The phosphor film 110 is positioned over the active surface 132 to alter the characteristics of the light directed away from the package 101. Accordingly, the phosphor film 110 can include a matrix material 111 having a distribution of phosphor elements 112. The phosphor elements 112 receive light from the LED 130 and emit the light at a different wavelength, for example, to produce a composite emitted light that is white rather than blue.

In a particular embodiment, the phosphor film 110 is formed from a self-supporting, shape-retaining yet pliant or conformable material. For example, the matrix material 111 of the phosphor film 110 can include a partially cured (e.g., b-stage) epoxy material that has enough strength to be handled when in film form, but which can conform to the LED and associated features when heated. During processing, the phosphor film 110 is brought into contact with the LED 130 and the support member 140, as indicated by arrows C, and heated to form an assembled unit described later with reference to FIG. 2. The matrix material 111 can soften due to the heat, allowing the phosphor film 110 to conform to the LED 130 and to the wire bonds 104 that connect the LED 130 to the support member 140. In a particular embodiment, the matrix material 111 is sufficiently compliant at elevated temperatures to conform, flow or otherwise deform around the wire bonds 104, without displacing, distorting, disturbing, or otherwise changing the location and/or shape of the wire bonds 104. Accordingly, the LED 130 can be wire bonded to the support member 140 prior to adding the phosphor film 110, without the phosphor film 110 disturbing the integrity of the wire bonds 104.

The matrix material 111 is also selected to be at least partially (and in particular embodiments, completely) transparent to radiation emitted by the LED 130 and the film 110. For example, in cases for which the LED emits blue light and the phosphor elements 112 emit yellow light, the matrix material 111 is selected to be generally transparent to both wavelengths. In certain embodiments, the film 110 can include multiple phosphor elements 112 with different phosphor elements selected to emit light at corresponding different wavelengths. In other embodiments, the package 101 can include multiple film layers 110, each having phosphor elements 112 that emit light at a corresponding different wavelength. In any of these embodiments, the matrix material 111 can be selected to be at least partially (and in particular embodiments, completely) transparent to one or more (e.g., all) the emitted wavelengths.

In a particular embodiment, the phosphor film 110 is strong enough to withstand routine microelectronic device handling techniques as a standalone unit. In other embodiments, the phosphor film 110 can be attached to the carrier 120, which can be rigid or semi-rigid so as to provide additional support to the phosphor film during the manufacturing process. Accordingly, the phosphor film 110 can include a first surface 113*a* facing toward the LED 130 and the support member 140, and a second surface 113*b* facing opposite from the first surface 113*a* and attached to the carrier 120. The carrier 120 is typically stiffer and/or more rigid than the phosphor film 120 to provide additional support. In a particular embodiment, the carrier 120 can include a generally flat, generally rigid, and generally transparent material that provides support to the phosphor film 110 without affecting the transmission of light away from the LED 130. For example, the carrier 120 can include a flat layer of glass that is transparent to radiation (e.g., light, and in particular embodiments, visible light). In other embodiments, the carrier 120 can include features that do affect the light emitted by the LED 130. For example, the carrier 120 can include a lens portion 121 that redirects light emitted from the LED 130. In another embodiment, the carrier 120 can include additional phosphor elements 112 beyond those present in the phosphor film 110. If the carrier 120 includes phosphor elements, the concentration of phosphor elements in the carrier 120 is generally less than the concentration of phosphor elements 112 in the phosphor film 110. The carrier 120 can be fixedly attached to the film 110, and can form a permanent part of the package 101. In other embodiments, the carrier can be released from the film 110 after the film 110 is attached to the LED 130 and the support member 140.

Figure 2:
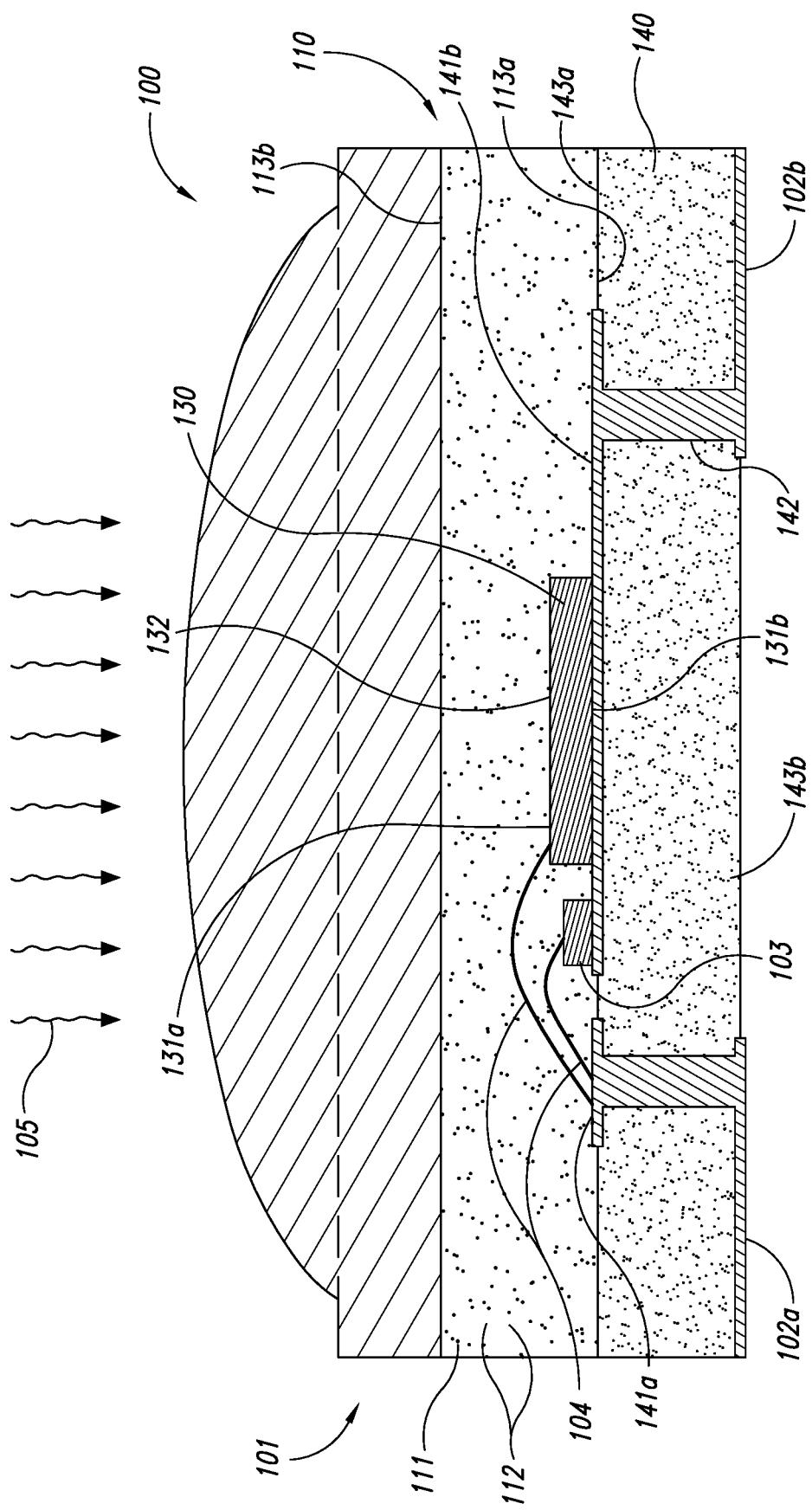
FIG. 2 is a partially schematic, cross-sectional side view of the components shown in FIG. 1, joined to form a package in accordance with an embodiment of the disclosure.

FIG. 2 illustrates the package 101 after the phosphor film 110 has been brought into contact with the LED 130 and the substrate 140. During the manufacturing process, heat 105 is applied to the elements of the package 101, allowing the phosphor film 110 to soften and conform to the wire bonds 104, the LED 130, the ESD die 103 (if present), and/or other features that may project from or be recessed from the first surface 143*a* of the substrate 140. Accordingly, the phosphor film 110 can completely surround, encapsulate, and/or otherwise accommodate the wire bonds 104 at the first LED bond site 131*a*, the first support member bond site 141*a*, and/or locations of the wire bond 104 between the two bond sites 113*a*, 141*a*. The entire package 101 can then be fully cured to harden the phosphor film 110 in the shape and position shown in FIG. 2, with the phosphor film 110 adhered to the LED 130 and the substrate 140.

Figure 3A:
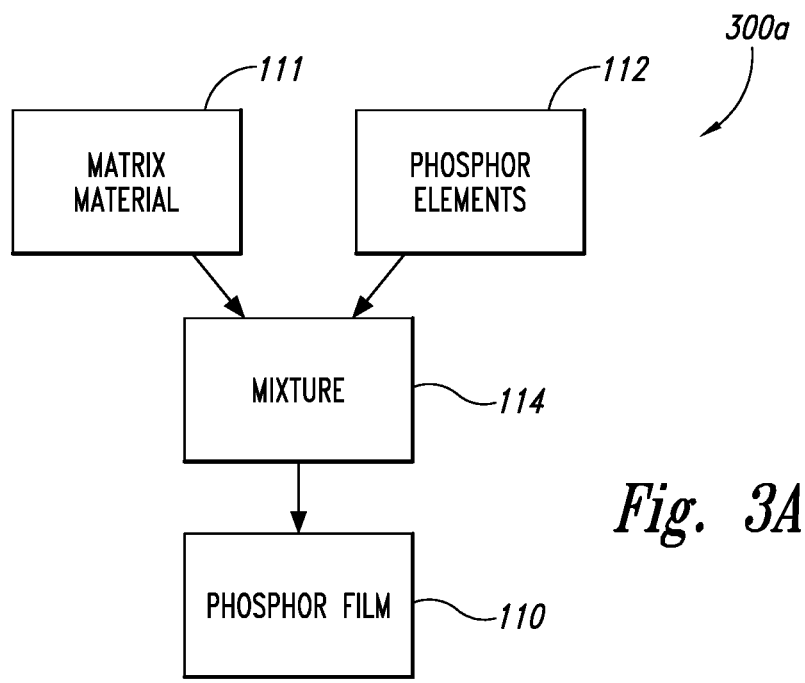
FIG. 3A is a flow diagram illustrating a process for forming a phosphor film in accordance with an embodiment of the disclosure.

FIG. 3A is a schematic block diagram illustrating a process 300*a* for forming a phosphor film 110 in accordance with an embodiment of the disclosure. In one aspect of this embodiment, a matrix material 111 (e.g., a softened, liquid, or otherwise flowable or malleable epoxy or other material) is combined with phosphor elements 112 to form a mixture 114. The phosphor elements 112 can be uniformly distributed in the matrix material 111. Thereafter, the mixture 114 can be shaped or otherwise manipulated to produce the phosphor film 110 in accordance with any of a variety of suitable techniques. Such techniques can include a spin-on process, a squeegee process, or another process that produces a phosphor film 110 having a uniform thickness. The phosphor film 110 can then be partially cured prior to being applied to the LED, as described above with reference to FIGS. 1 and 2.

Figure 3B:
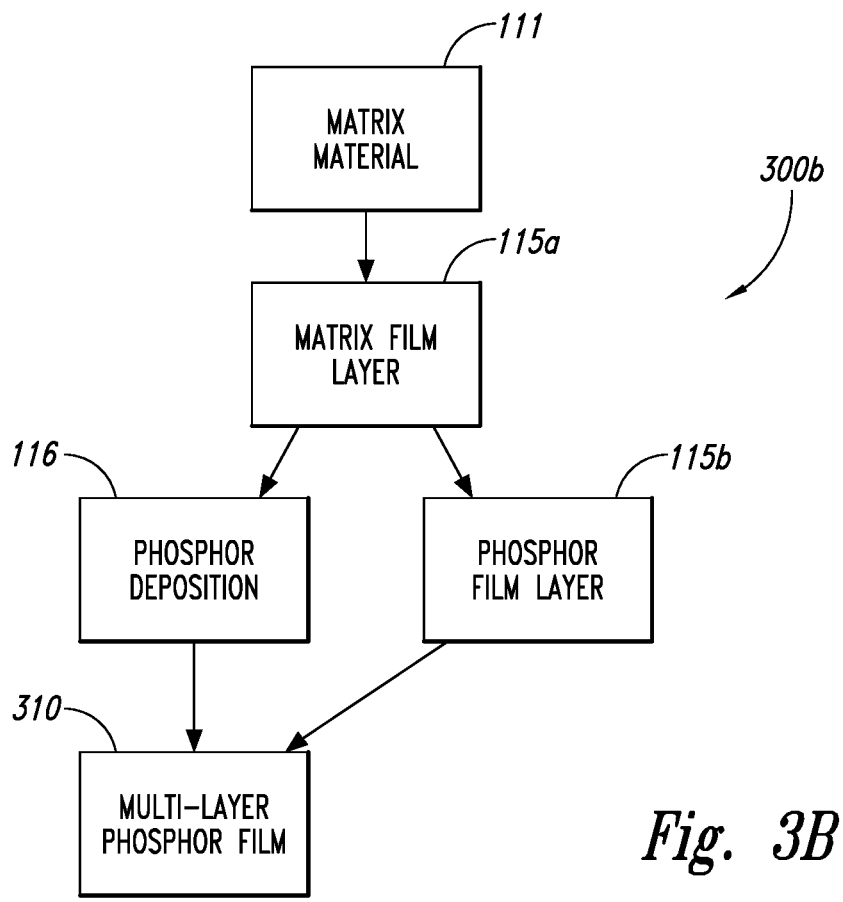
FIG. 3B is a flow diagram illustrating a process for forming a multi-layer phosphor film in accordance with another embodiment of the disclosure.

FIG. 3B illustrates another process 300*b* for forming a phosphor film 310 in accordance with multiple further embodiments. In these embodiments, the phosphor elements need not be distributed uniformly in the matrix material. For example, the process can include forming a matrix film layer 115a from the matrix material 111, using any of the film-forming processes described above. The matrix material 111 can accordingly have the adhesive and pliancy characteristics described above. The phosphor elements can then be disposed directly on the matrix film layer 115a using a phosphor deposition process (shown in block 116). In an alternative embodiment, the phosphor elements can themselves be formed into a separate, phosphor film layer 115b, also using any of the foregoing techniques described above. In this embodiment, the phosphor film layer 115b is then attached to the matrix film layer 115a. In either of the foregoing embodiments, the result is a multi-layer phosphor film 310 having a nonuniform distribution of phosphor elements.

Figure 4:
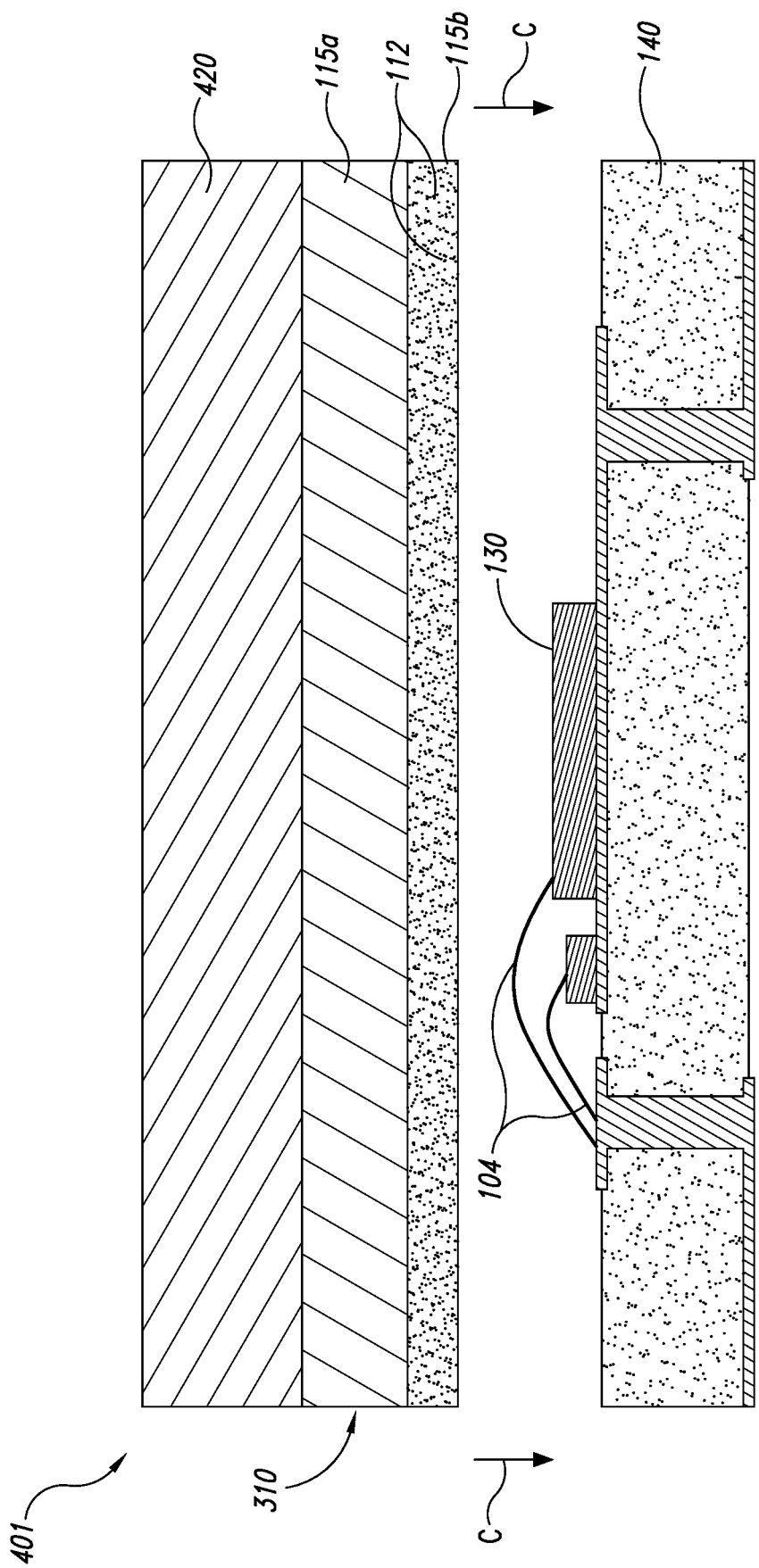
FIG. 4 is a partially schematic, cross-sectional exploded side view of a package having a multi-layer phosphor film in accordance with an embodiment of the disclosure.

FIG. 4 is a partially schematic, exploded elevation view of a package 401 having a multi-layer phosphor film 310, e.g., formed using any of the techniques described above with reference to FIG. 3B. The multi-layer phosphor film 310 can include the first layer 115a formed from a matrix material, and the second layer 115b formed from phosphor elements 112. As discussed above, the phosphor elements 112 and/or sets of phosphor elements 112 can be selected to emit radiation at one or more than one wavelength. The phosphor elements 112 are concentrated in a region that is directly adjacent to the LED 130. As discussed above with reference to FIG. 1, the multi-layer phosphor film 310 can be self supporting or not self supporting, and in either embodiment, can include a carrier 420 to provide additional support. In an embodiment shown in FIG. 4, the carrier 420 does not include a lens portion. In other embodiments, the carrier 420 can include a lens portion, e.g., similar to the lens portion 121 described above with reference to FIG. 1.

Figure 5:
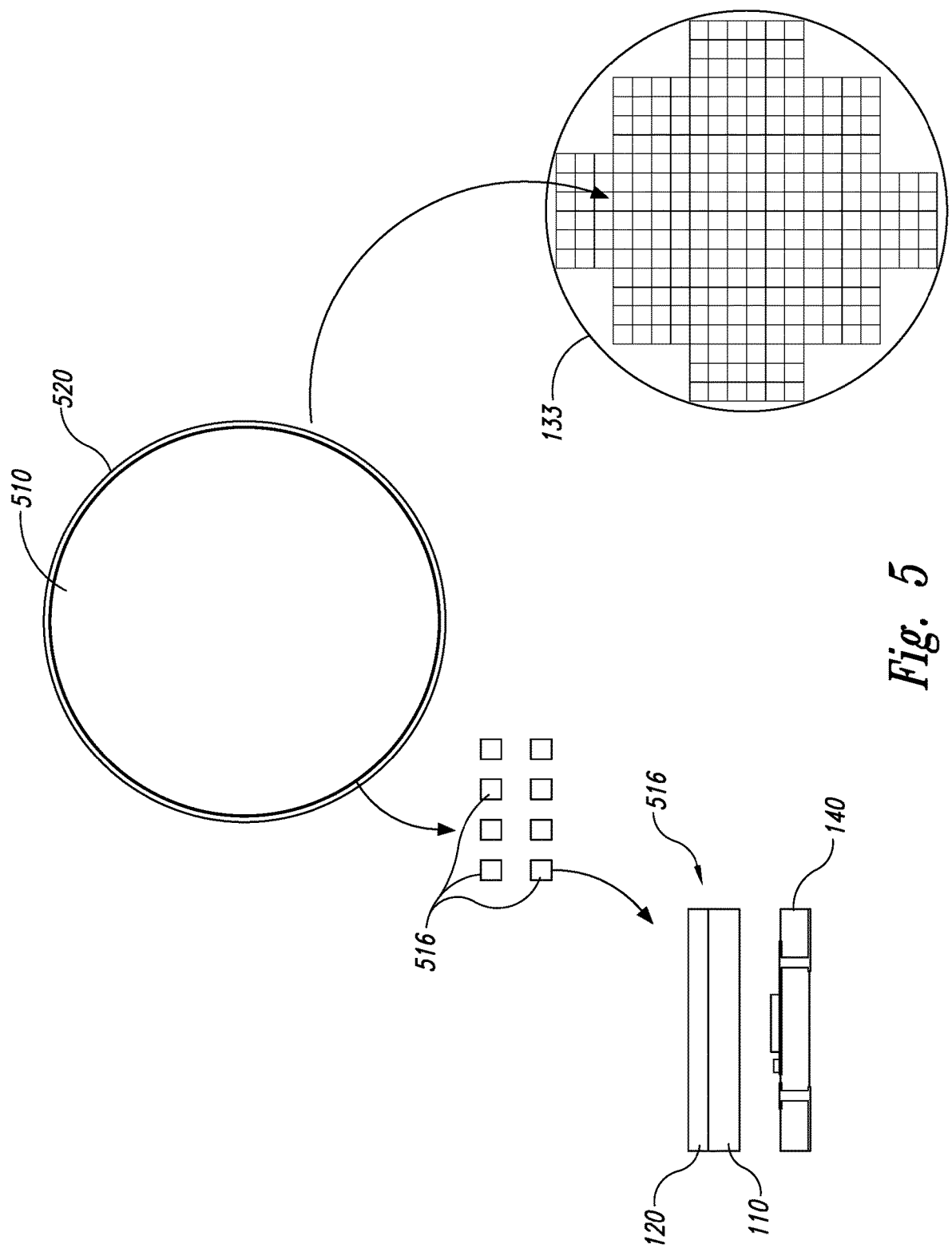
FIG. 5 is a partially schematic illustration of multiple methods for forming LED packages in accordance with further embodiments of the disclosure.

FIG. 5 is a partially schematic illustration of different techniques for applying the phosphor film to the LED in accordance with several embodiments of the disclosure. In a particular embodiment, the phosphor film 510 can be formed directly on a carrier wafer 520 and can be sized to provide coverage for a multitude of LEDs. In one aspect of this embodiment, the carrier wafer 520 and the film 510 can be diced together to form film elements 516. Individual film elements 516 are then individually placed on corresponding substrates 140 (one of which is shown in FIG. 5) using a conventional pick-and-place process. In another embodiment, the wafer carrier 520 and the film 510 can be diced after being attached to the corresponding LEDs. For example, the wafer carrier 520 and the associated film 510 can be attached directly to an LED wafer 133, having LEDs that are already wire bonded to pre-patterned or otherwise formed electrical lines in the LED wafer 133 itself. After the film 510 and the carrier wafer 520 have been attached to the LED wafer 133, the entire assembly can be diced or singulated to produce individual packages, e.g., having a configuration similar to that shown in FIG. 2.

In another embodiment, different phosphor films (e.g., phosphor films having different concentrations, distributions and/or types of phosphor elements) can be applied to singulated LEDs to account for differences in the output (e.g., color of the emitted light) produced by the LEDs. For example, individual LEDs typically have somewhat different emitted light characteristics due to variations in the associated manufacturing processes and are accordingly "binned" so that LEDs with similar light characteristics are grouped together. LEDs from different bins can receive phosphor films that have different phosphor characteristics to differentially adjust the light output of the resulting package. Using this technique, LEDs from different bins can be packaged so as to produce the same or nearly the same light output, and/or LEDs within a bin can be packaged to conform to other LEDs within the bin. An advantage of this technique is that it can reduce or eliminate the number of bins used to categorize LEDs, and/or improve the uniformity of LEDs within a bin.

One feature of at least some embodiments described above with reference to FIGS. 1-5 is that they can include a pre-formed, phosphor-containing film that is placed on a corresponding LED (at the wafer level or the individual die level) after the LED has been wire bonded to a suitable support structure. Because the phosphor elements are carried by a film, they need not be deposited directly on the LED in a liquid or other form. As a result, the support member need not include a cavity, recess, dam, or other containment feature that contains and/or confines the phosphor elements. In addition, it is expected that in at least some embodiments, the distribution of phosphor elements, once applied to the LED, will be more uniform than the distribution obtained with conventional techniques.

Another advantage of embodiments of the foregoing process is that, because the film is compliant, it can conform to the shape of the underlying wire bonds, without further processing. In particular, the conformal nature of the film can eliminate the need to cut grooves or recesses in the film to accommodate the wire bonds. Accordingly, the process can require fewer steps than are used in some conventional techniques. Embodiments of the process can also eliminate the need to lay down a separate layer that covers the wire bonds, prior to disposing the phosphor elements on the LED, which is a process used in other conventional techniques. This feature allows the phosphor in the film 110 to be positioned directly adjacent to the LED 130, e.g., directly adjacent to the active surface 132. Still further, the phosphor elements can be added to the film prior to engaging a film with the LEDs. This feature allows the film to be manufactured entirely separately from the LED dies, e.g., in parallel with manufacturing and processing the dies. This arrangement can reduce the flow time required to package a die and can allow the dies and films to be formed or stockpiled separately, which reduces the likelihood for bottlenecks to form in the overall manufacturing process. The foregoing features, alone or in combination, can reduce the time and expense associated with packaging the die and, accordingly, can reduce the cost of the resulting die package.

From the foregoing, it will be appreciated that specific embodiments of the disclosure have been described herein for purposes of illustration, but that various modifications may be made without deviating from the disclosure. For example, the matrix material can include other compositions (e.g., other than epoxy), that also provide support for the phosphor elements, and that have adhesive characteristics to facilitate bonding to the LED and/or the support member. Such materials can include, but are not limited to, solid state, partially cured thermoset adhesive materials, of which b-stage epoxy is one example. The LEDs can have shapes, sizes, and/or other characteristics different than those shown in the Figures. Certain aspects of the disclosure described in the context of particular embodiments may be combined or eliminated in other embodiments. For example, the carrier 120 shown in FIG. 1 may be eliminated in some embodiments, and may be combined with the phosphor film shown in FIG. 4 in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

What is claimed is:

1. A method for manufacturing an LED assembly, comprising:
   mounting an LED to a support member;
   electrically connecting the LED to the support member with a wire bond;
   heating a self-supporting pre-shaped phosphor film;
   applying the heated self-supporting pre-shaped phosphor film to the wire bond, the LED and the support member such that the phosphor film deforms around and completely surrounds the wire bond without changing a location and/or shape of the wire bond; and
   curing the phosphor film.

2. The method of claim 1, wherein the phosphor film includes a first layer of matrix material, and a second layer of phosphor elements disposed in surface-to-surface contact with the first layer of matrix material.

3. The method of claim 2, wherein the matrix material is at least partially transparent to radiation emitted by the LED.

4. The method of claim 1, wherein during application, the heated self-supporting pre-shaped phosphor film is attached to a carrier having a stiffness greater than a stiffness of the phosphor film.

5. The method of claim 1, wherein the support member includes a lens portion opposite the phosphor film from the LED.

6. The method of claim 1, wherein the support member includes a generally flat material that is transparent to radiation emitted by the LED.

7. The method of claim 1, wherein the support member includes additional phosphor elements at a lower concentration than a concentration of phosphor elements in the phosphor film.

8. The method of claim 1, further comprising forming the phosphor film by:
   mixing phosphor elements with a matrix material; and
   partially curing the matrix material.

9. The method of claim 1, wherein the LED is a first LED having a first output characteristic, the support member is a first support member, the wire bond is a first wire bond and the phosphor film is a first phosphor film having first phosphor characteristics, and wherein the method further comprises:
   mounting a second LED to a second support member, the second LED having a second output characteristic different than the first;
   electrically connecting the second LED to the second support member with a second wire bond;
   heating a second self-supporting pre-shaped phosphor film having a second phosphor characteristic different than the first phosphor characteristic to at least partially compensate for the difference between the first output characteristic and the second output characteristic;
   applying the second heated self-supporting pre-shaped phosphor film to the second wire bond, the second LED and the second support member such that the second phosphor film deforms around and completely surrounds the second wire bond without changing a location and/or shape of the second wire bond; and
   curing the second phosphor film.

10. The method of claim 9, wherein the first output characteristic is a first color characteristic and wherein the second output characteristic is a second color characteristic different than the first color characteristic.

11. The method of claim 10, wherein the first color characteristic is a first wavelength and the second color characteristic is a second wavelength different than the first wavelength.

12. A method for manufacturing a plurality of LED assemblies, comprising:
   mounting a plurality of LEDs to a wafer;
   electrically connecting the plurality of LED to the wafer with a corresponding plurality of wire bonds;
   heating a self-supporting pre-shaped phosphor film;
   applying the heated self-supporting pre-shaped phosphor film to the plurality of wire bonds, the plurality of LEDs and the wafer such that the phosphor film deforms around and completely surrounds each of the plurality of wire bonds without changing a location and/or shape of the plurality of wire bonds; and
   curing the phosphor film.

13. The method of claim 12, further comprising singulating the wafer to separate the plurality of LED assemblies from one another.

14. The method of claim 12, wherein the phosphor film includes a first layer of matrix material, and a second layer of phosphor elements disposed in surface-to-surface contact with the first layer of matrix material.

15. The method of claim 14, wherein the matrix material is at least partially transparent to radiation emitted by the plurality of LEDs.

16. The method of claim 12, wherein during application, the heated self-supporting pre-shaped phosphor film is attached to a carrier having a stiffness greater than a stiffness of the phosphor film.

17. The method of claim 12, wherein the wafer includes a plurality of lens portions opposite the phosphor film from and corresponding to the plurality of LEDs.

18. The method of claim 12, wherein the wafer includes a generally flat material that is transparent to radiation emitted by the plurality of LEDs.

19. The method of claim 12, wherein the wafer includes additional phosphor elements at a lower concentration than a concentration of phosphor elements in the phosphor film.

20. The method of claim 12, further comprising forming the phosphor film by:
   mixing phosphor elements with a matrix material; and
   partially curing the matrix material.

* * * * *